US010699783B1

(12) United States Patent
Raad et al.

(10) Patent No.: US 10,699,783 B1
(45) Date of Patent: Jun. 30, 2020

(54) SENSING TECHNIQUES USING A MOVING REFERENCE

(71) Applicant: Micron Technology, Inc., Boise, ID (US)

(72) Inventors: George B. Raad, Boise, ID (US); John F. Schreck, Lucas, TX (US)

(73) Assignee: Micron Technology, Boise, ID (US)

( * ) Notice: Subject to any disclaimer, the term of this patent is extended or adjusted under 35 U.S.C. 154(b) by 0 days.

(21) Appl. No.: 16/232,317

(22) Filed: Dec. 26, 2018

(51) Int. Cl.
*G11C 7/06* (2006.01)
*G11C 11/4091* (2006.01)
*G11C 11/56* (2006.01)

(52) U.S. Cl.
CPC ........ *G11C 11/565* (2013.01); *G11C 11/5657* (2013.01); *G11C 2211/5634* (2013.01)

(58) Field of Classification Search
CPC . G11C 16/0483; G11C 16/26; G11C 11/5642; G11C 16/10; G11C 13/004; G11C 11/1673; G11C 7/00; G11C 11/1655; G11C 16/08; G11C 7/062; G11C 7/06; G11C 7/227; G11C 11/1693
See application file for complete search history.

(56) References Cited

U.S. PATENT DOCUMENTS

| 9,858,979 | B1* | 1/2018 | Derner | G11C 11/2275 |
| 9,886,991 | B1* | 2/2018 | Vimercati | G11C 11/2273 |
| 10,535,397 | B1* | 1/2020 | Kawamura | G11C 7/062 |
| 2001/0024396 | A1* | 9/2001 | Bohm | G11C 11/22 365/210.1 |
| 2004/0001378 | A1* | 1/2004 | Madan | G11C 7/065 365/202 |
| 2009/0225594 | A1* | 9/2009 | Choi | G11C 8/10 365/185.03 |
| 2015/0009756 | A1* | 1/2015 | D'Alessandro | G11C 16/26 365/185.17 |

* cited by examiner

Primary Examiner — Hien N Nguyen
(74) Attorney, Agent, or Firm — Holland & Hart LLP

(57) ABSTRACT

Techniques are provided for sensing a signal associated with a memory cell capable of storing one of three or more logic states. To sense the memory cell (e.g., to sense the signal associated with the memory cell), a first sense component may compare the signal with a first reference value. A reference selector may select a second reference value based on the comparison of the signal with the first reference value. A second sense component may compare the signal with the second reference value. The logic state of the memory cell may be determined based on the results of the first comparison and the second comparison.

25 Claims, 7 Drawing Sheets

US 10,699,783 B1

SENSING TECHNIQUES USING A MOVING REFERENCE

BACKGROUND

The following relates generally to a system that includes at least one memory device and more specifically to sensing techniques using a moving reference during a read operation of a memory cell.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source.

Techniques for improving memory devices, generally, may include increasing memory cell density, increasing read/write speeds, increasing reliability, increasing accuracy, increasing data retention, reducing power consumption, or reducing manufacturing costs, among other metrics. For memory cells configured to store more than two states, multiple sensing components may be used to increase the accuracy, reliability, and/or speed of a read operation of the memory cell, among other benefits.

DETAILED DESCRIPTION

Figure 1:
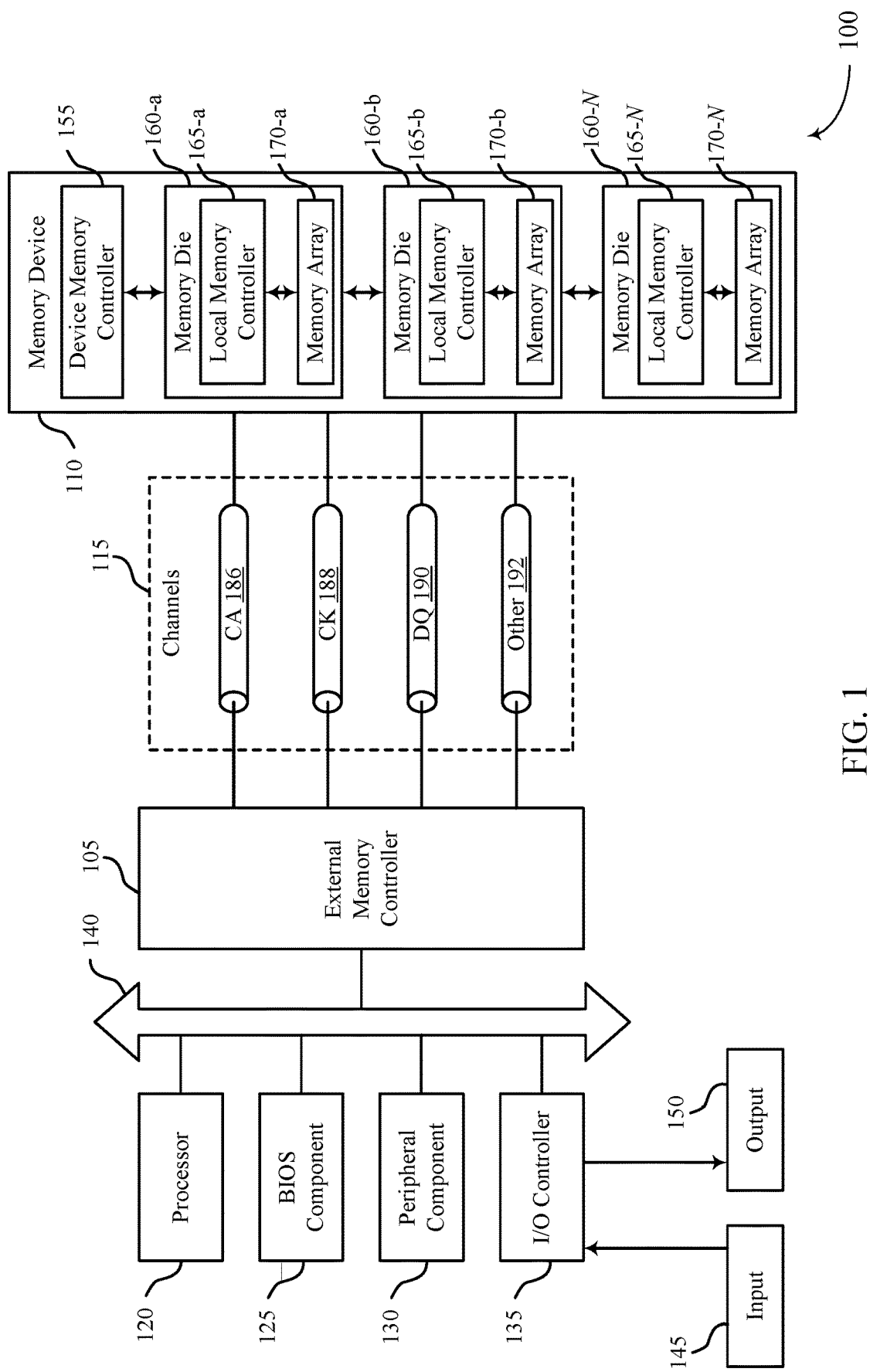
FIG. 1 illustrates an example of a system that supports sensing techniques using a moving reference in accordance with aspects of the present disclosure.

A single memory cell may be configured to store one or more bits of digital data as one or more logic states of the memory cell. For a one-bit (e.g., two-state) memory cell, for example, the possible logic states may be 0 and 1. For a two-bit (e.g., four-state) memory cell, the possible logic states may be 00, 01, 10, and 11. Each such state may be represented by a particular voltage level. Thus, determining a logic state stored on a memory cell (e.g., during a read operation) may include determining a voltage level associated with the memory cell.

For memory cells storing a single bit, a single sense component may be used to compare a signal representing the state of the memory cell with a single reference value (e.g., a reference voltage) to determine the state of the memory cell. If the signal voltage is higher than the reference voltage, the state may be determined as a first state (e.g., a 1). If the signal voltage is lower than the reference voltage, the state may be determined as a second state (e.g., a 0).

For memory cells that are configured to store more than one bit (e.g., more than two states), a single comparison with a single reference value may be insufficient to determine the state of the memory cell, because there may be more than two voltage levels used to represent the states. For example, determining the state of a four-state memory cell may require identifying which of four possible voltage levels is associated with the state stored on the memory cell. In this case, multiple comparisons of the signal voltage with multiple reference voltages (e.g., using multiple sense components) may be used to determine the state of the memory cell. For example, a first sense component may be used to compare the signal with a first reference value to determine whether the signal is higher or lower than this first reference value. In such examples, the comparison performed by the first sense component may be used to narrow the number of possible states from four to two using a reference voltage that is between the higher two possible voltages and lower two possible voltages. A second sense component may then compare the signal with a second reference value to determine the particular state stored on the memory cell. For memory cells that are configured to store more than four states, additional sense components or comparisons may be used. Thus, the state of the memory cell may be determined based on the results of two (or more) comparisons by two (or more) sense components.

In some cases, a memory device may include a reference selector to select a reference value for the second comparison based on the result of the first comparison. For example, if the first sense component determines that the signal is lower than a first reference value, then the reference selector component may select a second reference value that is lower than the first reference value to enable determination of the state. Conversely, if the first sense component determines that the signal is higher than the first reference value, the reference selector component may select a second reference value that is higher than the first reference value. Thus, the sense operation may use a "moving" (e.g., selectable, non-static) reference value to determine the state of the memory cell.

Techniques are provided for sensing a multi-level memory cell using a moving reference. In some examples, a multi-level memory cell may store multiple logic states, such as three logic states (e.g., 0, mid, 1) and, in other examples, a multi-level memory cell may store four or more logic states (e.g., 00, 01, 10, 11). To sense a logic state of the multi-level memory cell, a charge may be transferred between a digit line coupled with a multi-level memory cell and two or more sense components. A charge transfer device may be used to transfer the charge between the digit line and the two or more sense components. The charge transfer device may improve (e.g., increase) the sense window, which may be useful in the context of multi-level memory cells that use relatively small differences in voltages to indicate different logic states. The charge transfer device may be coupled with the digit line and the sense component, such that when a voltage of the digit line (e.g., a voltage that arises due to the multi-level memory cell being discharged onto the digit line) is less than a voltage of a gate of the charge transfer device, the charge is transferred to a signal node that is coupled with the first sense component and the second sense component.

Features of the disclosure are initially described in the context of a memory system. Features of the disclosure are described in the context of a memory die, a memory circuit, and timing diagrams that support sensing techniques using a moving reference in accordance with aspects of the present disclosure. These and other features of the disclosure are further illustrated by and described with reference to an apparatus diagram and flowcharts that relate to sensing techniques using a moving reference.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 to support a desired or specified capacity for data storage. The memory device 110 including two or more memory dice may be referred to as a multi-die memory or package.

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components understood by those skilled in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, memory device 110 may be coupled with multiple sense components. Each memory cell, for example, may be coupled with the sense components via a digit line coupled with a charge transfer device (e.g., a transistor). The gate of the charge transfer device may be coupled with a compensation device (e.g., a second transistor) and a capacitor configured to compensate for a threshold voltage associated with the charge transfer device. In some examples, the charge transfer device may be configured to transfer a charge between the digit line and the sense component based on a memory cell being discharged onto the digit line. Subsequently, each sense component may sense a respective charge using a fixed reference voltage, multiple reference voltages, at a same time, at different times, or a combination thereof.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. As described above, the memory device 110 may be coupled with multiple sense components. For example, each memory cell (e.g., of a respective memory array) may be coupled with the sense components via digit line and a charge transfer device (e.g., a transistor). In some examples, the gate of each transistor may be coupled with a compensation device (e.g., a second transistor) and a capacitor configured to compensate for a threshold voltage associated with the charge transfer device.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some examples, the device memory controller 155 may be configured to control the operations of a memory array as it relates to a read operation using a moving reference. For example, each memory cell of memory array 170-a may be coupled with a node of at least a first sense component and a second sense component via a respective digit line. In some examples, the digit line may be coupled with a charge transfer device configured to transfer a charge between the digit line and the node based on a memory cell being discharged onto the digit line.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some examples, the memory cell may be sensed (e.g., read) by the local memory controller 165 transferring, using a first transistor, a charge between the digit line and the node coupled with the first sense component and the second sense component. In some examples, the first sense component may compare the signal at the node to a first reference value. In some examples, a reference selector may be used to select a second reference value based on the comparison of the signal to the first reference value. In some examples, the second sense component may compare the signal at the node to the second reference value. In some examples, the local memory controller 165 may determine the logic state stored on the memory cell based on the comparison of the signal at the node with the second reference value.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes. For example, the modulation schemes may include non-return-to-zero (NRZ), pulse amplitude modulation (PAM) having four symbols (e.g., PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic state 1 or a logic state 0). Examples of binary-symbol modulation schemes include, but are not limited to, NRZ, unipolar encoding, bipolar encoding, Manchester encoding, pulse amplitude modulation having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic state 00, a logic state 01, a logic state 10, or a logic state 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three voltage levels to encode more than one bit of information. Multi-symbol modulation schemes and symbols may alternatively be referred to as non-binary, multi-bit, or higher-order modulation schemes and symbols.

In some cases, multi-level memory cells (e.g., memory cells configured to store one of three or more states, as described herein) may be used in a memory device to support such modulation schemes and improve the access speed, efficiency, and/or storage capacity of the memory device. Such memory cells may be sensed using a moving reference as described with reference to FIGS. 3 through 7.

Figure 2:
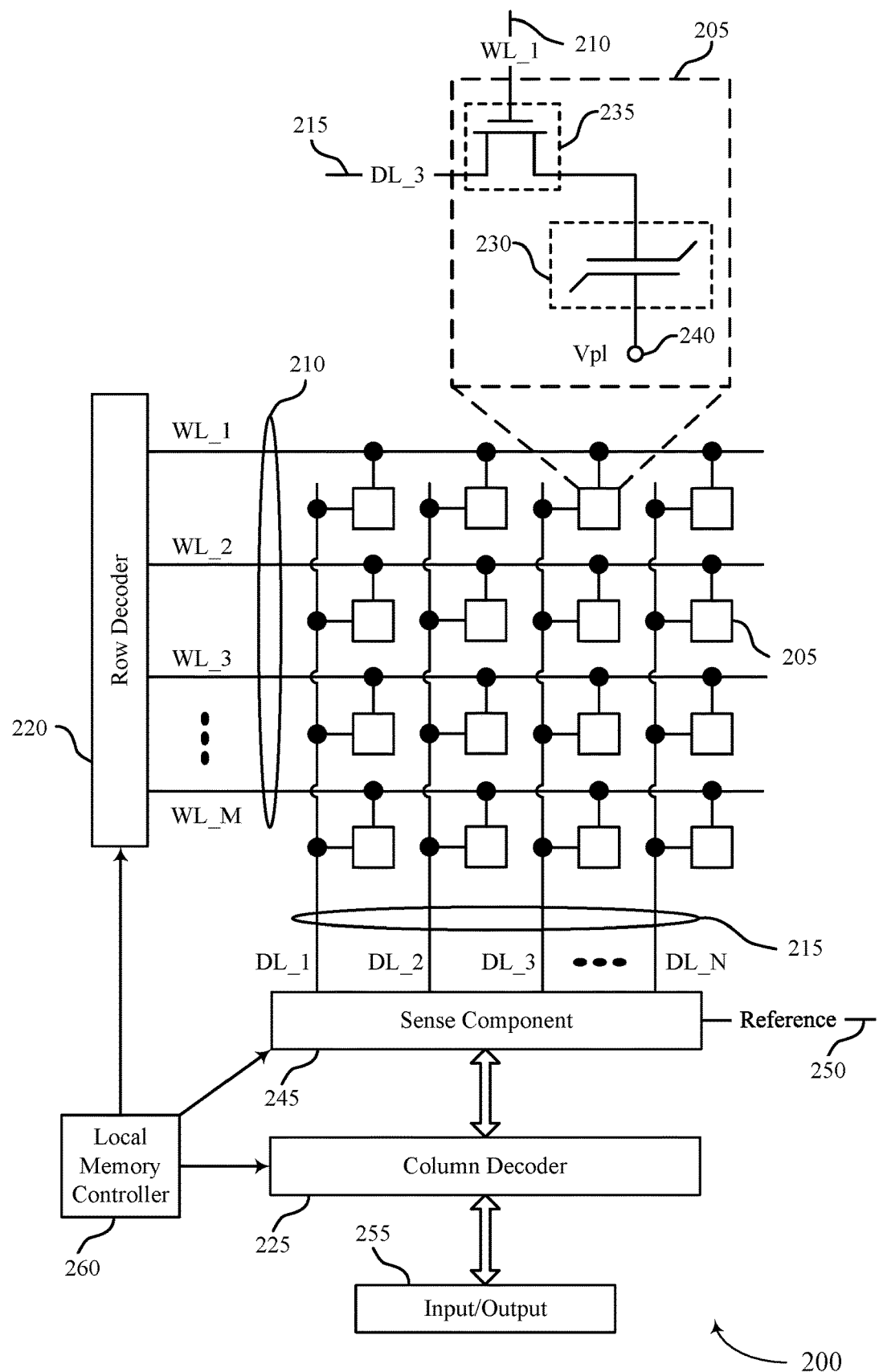
FIG. 2 illustrates an example of a memory die that supports sensing techniques using a moving reference in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store one of two or more logic states.

A memory cell 205 may store a charge representative of the programmable states in a capacitor. DRAM architectures, for example, may include a capacitor that includes a dielectric material to store a charge representative of the programmable state. In some examples, the digit line may be coupled with a charge transfer device configured to transfer charge between the digit line and a signal node (e.g., a node at which one or more sense components senses the signal) during a read operation. That is, the charge transfer device may be coupled with both the digit line and the signal node.

In some examples, the charge transfer device may improve a quality of the signal (e.g., of the charge) transferred to the signal node. For example, the signal transferred to the signal node (and therefore, to the sense components) may be amplified such that the difference between the voltages associated with two different states (e.g., the sense window) is greater, which may improve the reliability of the read operation. Such a charge transfer device may be particularly useful in the context of read operations for multi-state memory cells, which may use relatively small differences in voltages (or corresponding charges) to represent multiple different states.

During a read operation, a charge representative of the logic state stored on the memory cell may be transferred to the signal node—via the charge transfer device—and may be sensed by at least one of the first sense component or the second sense component. The charge may represent, for example, one of four logic states stored to the memory cell 205 (e.g., logic state 00, 01, 10, or 11).

Operations such as reading and writing may be performed on memory cells 205 by activating or selecting access lines such as a word line 210 and/or a digit line 215. In some cases, a digit line 215 may also be referred to as a bit line. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215 to activate word line 210 or digit line 215), a single memory cell 205 may be accessed at their intersection.

Accessing the memory cells 205 may be controlled through a row decoder 220 and a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vp1. In some cases, the voltage source 240 may be an example of a plate line coupled with a plate line driver. The switching component 235 may be an example of a transistor or any other type of switch device that selectively establishes or de-establishes electronic communication between two components. In some examples, memory cell 205 may be or may be referred to as a multi-level or multi-state memory cell that may be configured to store one of three or more states (e.g., three or more logic states).

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the threshold voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

As described above, the digit line 215 may be coupled with a charge transfer device (e.g., a transistor), which may couple the digit line with a signal node that is sensed by multiple sense components. In some examples, the digit line 215 may be configured to receive a charge from (e.g., to be biased by) memory cell 205. Stated another way, memory cell 205 may be discharged onto digit line 215, which may bias the digit line to a particular voltage. The voltage of the digit line may thus be representative of or related to a logic state stored on memory cell 205. For example, if memory cell 205 were to store a logic state 0 and be discharged onto digit line 215, the digit line may be biased to a different voltage than if memory cell 205 were to store a logic state 1 and be discharged onto digit line 215. In some examples, the charge transfer device may transfer the voltage that is discharged onto the digit line 215 to the signal node and thereby to each of the sense components, which may determine a logic state of the memory cell 205.

The sense component 245 may be configured to detect the logic state of the memory cell 205 based on the charge stored on capacitor 230 of memory cell 205. The charge stored by a capacitor 230 of a memory cell 205 may be extremely small, in some cases. As such, the sense component 245 may include one or more sense amplifiers to amplify the signal output by the memory cell 205. The sense amplifiers may detect small changes in the charge or voltage of a digit line 215 or signal node during a read operation and may produce signals corresponding to the logic state of the memory cell based on the detected charge.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may activate the sense component 245 (e.g., turn on, latch, or "fire" the sense component) and thereby cause the sense component to compare the signal received from the memory cell 205 (e.g., the signal at the signal node) to a reference signal 250 (e.g., a reference value, reference voltage).

Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

For a memory cell configured to store one of two states (e.g., to support binary-symbol modulation schemes), if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

As described with respect to FIGS. 3-7, for a memory cell configured to store one of three of more states, multiple sense components may be coupled with memory cell 205 (e.g., via a signal node coupled with the digit line), and each sense component may be configured to sense a voltage of the signal node at a different time. The logic state stored on the memory cell may be determined based on the results of the comparisons.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
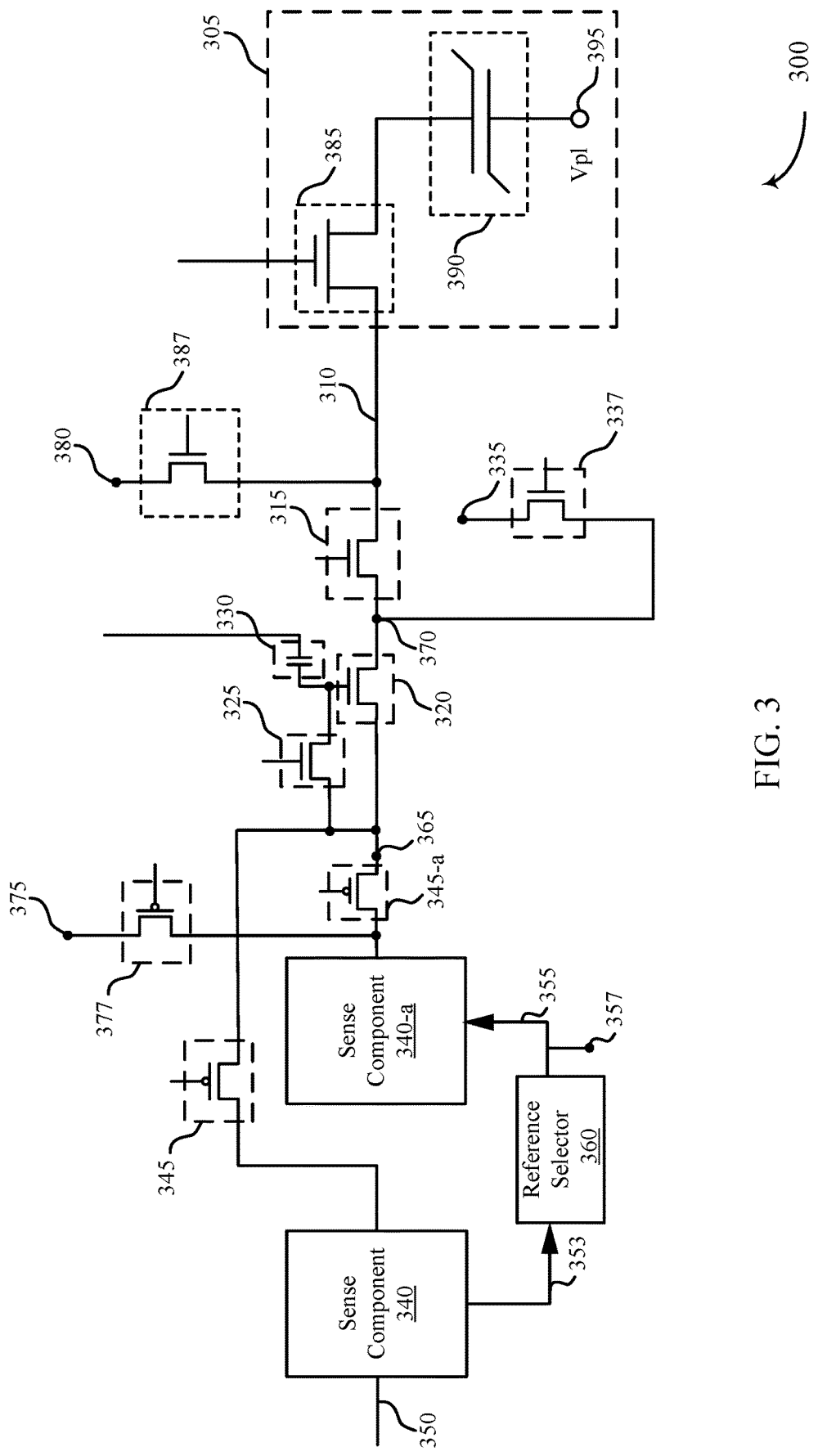
FIG. 3 illustrates an example circuit that supports sensing techniques using a moving reference in accordance with aspects of the present disclosure.

FIG. 3 illustrates an example circuit 300 that supports sensing techniques using a moving reference in accordance with aspects of the present disclosure. In some examples, circuit 300 may include one or more components described above with reference to FIGS. 1 and 2. For example, circuit 300 may include a memory cell 305, which may be an example of memory cell 205 as described with reference to FIG. 2; a digit line 310, which may be an example of digit line 215 as described with reference to FIG. 2; and a first sense component 340 and a second sense component 340-a, which each may be examples of sense component 245 as described with reference to FIG. 2.

Circuit 300 may include a reference selector 360 for selecting a second reference value, described in more detail with respect to FIGS. 4-7.

Circuit 300 may include an isolation device 315, a charge transfer device 320, a compensation device 325, a capacitor 330, a voltage source 335 a first reference line 350, and a second reference line 355. In some examples, circuit 300 may include a voltage source 357 for biasing the second reference line 355 to an initial value, and one or more output lines 353 from sense component 340 that may be used by reference selector 360 to select a second reference value.

Circuit 300 may include transistors 345, 345-a, which may each be referred to as an isolation switch, and may be used to isolate sense component 340, 340-a (respectively) from signal node 365 during a portion of a read operation of memory cell 305. Such isolation may reduce the amount of noise introduced at the signal node 365 during sensing operations.

In some examples, the circuit 300 may include a signal node 365 that may be coupled with the digit line 310, the first sense component 340, and the second sense component 340-a. In some examples, the circuit 300 may include a second node 370, a voltage source (e.g., a CT precharge voltage source) 375, and a voltage source (e.g., a DVC2 voltage source, which may generate a voltage of Vcc/2) 380. In some examples, the memory cell 305 may include a transistor (e.g., a switching component) 385 and a capacitor 390, which may be coupled with a voltage source 395. In some examples, the voltage source 395 may provide the cell plate reference voltage, Vp1.

In some examples, memory cell 305 may be indirectly coupled with signal node 365, which may be coupled with first sense component 340 and second sense component 340-a. For example, memory cell 305 may be coupled with digit line 310, which may be coupled with isolation device 315. Additionally or alternatively, isolation device 315 may be coupled with charge transfer device 320, which may be coupled with signal node 365. In some examples, as described above, memory cell 305 may be discharged onto digit line 310 during a read operation. Thus, in some examples, the resulting voltage of the digit line 310 (e.g., a resulting charge on digit line 310) may be transferred to signal node 365 by way of isolation device 315 and charge transfer device 320. The transfer may occur, in part, based on whether isolation device 315 is active (or inactive) and on a voltage applied to the gate of charge transfer device 320.

In some examples, during the read operation, the first sense component 340 may compare a signal at signal node 365 with a first reference value received on first reference line 350 and the second sense component 340-*a* may compare the signal at signal node 365 (e.g., received via transistor 345-*a*) with a second reference value received on second reference line 355 as part of a process to determine a logic state stored on the memory cell.

For a memory cell configured to store one of three states, each of which is associated with a different voltage level (e.g., a high, medium, and low voltage level, associated with high, medium, and low logic states, respectively), the first reference value may be a voltage that is between the high voltage level and the low voltage level. In some cases, the first reference value may be a voltage that is substantially equal to the medium voltage level. In some examples, if the signal at the signal node 365 is higher than the first reference value, then the logic state may be the high logic state or the medium logic state, but not the low logic state. If the signal at the signal node 365 is lower than the first reference value, then the logic state may be the low logic state or the medium logic state, but not the high logic state. Thus, the first sense component may be used to narrow the number of possible logic states stored on the memory cell from three to two.

For a memory cell configured to store one of four states, each of which is associated with a different voltage level (e.g., a high, mid-high, mid-low, and low voltage level), the first reference value may be a voltage that is between the mid-high voltage level and the mid-low voltage level; e.g., the first reference value may be a voltage that bisects the possible voltage levels associated with the four states. In some examples, if the signal at the signal node 365 is higher than the first reference value, then the logic state stored on the memory cell may be the high logic state or the mid-high logic state, but not the mid-low logic state or the low logic state. If the signal at the signal node 365 is lower than the first reference value, then the logic state stored on the memory cell may be the mid-low logic state or the low logic state, but not the high logic state or the mid-high logic state. Thus, the first sense component may narrow the number of possible logic states stored on the memory cell from four to two.

In some cases, a second sense component 340-*a* may also be used to determine the logic state stored on the memory cell. For example, after the number of possible logic states has been narrowed to two (e.g., by a comparison performed by the first sense component 340), second sense component 340-*a* may determine which of the two possible logic states is stored on memory cell 305. In some cases, second sense component 340-*a* may determine the logic state by comparing a signal at signal node 365 with a second reference value to determine which of the two possible logic states is the logic state stored on the memory cell.

In some cases, a reference selector 360 may select the second reference value that is used by the second sense component 340-*a*. In some cases, the reference selector may select the second reference value from a set of second reference values, such as a higher second reference value (e.g., having a higher voltage than the first reference value) and a lower second reference value (e.g., having a lower voltage than the first reference value). In some cases, the reference selector 360 may select the second reference value (e.g., the higher second reference value or lower second reference value) based on the result of the comparison of the signal at the signal node 365 with the first reference value. For example, the reference selector may select the higher second reference value if the first sense component determines that the signal at the node is greater than the first reference value and select the lower second reference value if the first sense component determines that the signal at the node is less than the first reference value.

In some cases, first sense component 340 may provide an indication, to the reference selector 360, of the result of the first comparison on one or more output lines 353 coupled with the reference selector 360. In some cases, reference selector 360 may select the second reference voltage based on the indication of the result received from first sense component 340 on output line(s) 353.

Thus, in some cases, second sense component 340-*a* may compare the signal at signal node 365 with the second reference value after first sense component 340 has compared the signal at the signal node 365 with the first reference value. In some cases, sense component 340 and 340-*a* may be configured to operate as a cascade of serial sense components, thereby serving as a decision tree for determining the logic state stored on memory cell 305.

In some cases, the second reference line 355 may be biased to an initial value prior to the selection of the second reference value to reduce the amount of noise that may be introduced into the system due to a change in voltage on the second reference line when the second reference value is selected. Reducing the noise during the sensing portion of a read operation may be particularly important for reading memory cells that are configured to store one of three or more states, which may (as previously described) represent different states using relatively small differences in voltage or charge in comparison to memory cells that are configured to store one of two states and may therefore be more sensitive to noise.

In some cases, the second reference line 355 may be biased to an initial value (e.g., a voltage) that is between the higher second reference value and lower second reference value such that selection of either of the second reference values causes a relatively small change in voltage on the second reference line, thereby reducing the amount of noise that may be introduced into the system.

In some cases, the second reference line 355 may be biased to an initial value that is substantially equal to either the higher second reference value or the lower second reference value. In this case, if the corresponding second reference value is selected, there may be essentially no change to the voltage on the second reference line and therefore no additional noise may be introduced into the system. However, if the alternative second reference value is selected (e.g., the second reference value that is different than the initial value to which the second reference line is biased), then there may be more noise introduced than in the case where the second reference line is biased to a voltage between the higher second reference value and the lower second reference value.

In some cases, a transistor 345 (e.g., an isolation switch) may be used to isolate the first sense component 340 from the second sense component 340-*a* and/or from the signal node 365 prior to the first sense component 340 being activated and comparing the signal at the signal node 365 to the first reference value. Such isolation may help reduce the amount of noise that may be introduced into the system during the sensing process (e.g., noise introduced when the first sense component 340 is activated or fired).

In some cases, the charge transfer device 320, which may be used to transfer a charge or voltage from digit line 310 to signal node 365 as previously discussed, may be coupled with isolation device 315, compensation device 325, and capacitor 330. The charge transfer device 320 may be, in some examples, a transistor. In some cases, a gate of the charge transfer device 320 may be coupled with the compensation device 325 and the capacitor 330; a source of the charge transfer device 320 may be coupled with isolation device 315 (e.g., which is coupled with memory cell 305); and a drain of the charge transfer device 320 may be coupled with signal node 365. The charge transfer device 320 may be configured to transfer a charge (e.g., a charge received at its source) based on a voltage of the digit line 310 being less than a voltage of the gate of the charge transfer device 320. Stated another way, a voltage may be applied to the gate of charge transfer device 320 to activate the charge transfer device 320 based on a voltage applied to the source of the charge transfer device 320. With the charge transfer device 320 being activated, the device may transfer a charge to the signal node 365 to be sensed by first sense component 340 and/or second sense component 340-*a*.

A read operation performed by the circuit 300 may be divided into different phases. A precharge phase may be used to precharge the signal node 365 (e.g., to a CT precharge voltage) and/or the digit line (e.g., to a DVC2 voltage) to their respective precharge voltages. A compensation phase may be used to set a gate voltage for the gate of the charge transfer device 320 that compensates for fabrication variations. A cell dump phase may be used to dump the state (e.g., the charge) of the memory cell 305 onto the digit line 310. In some examples, the compensation phase and the cell dump phase may be performed serially. In some examples, the compensation phase and the cell dump phase may be performed, at least in part, concurrently. After the compensation phase, the compensation device 325 may be deactivated thereby causing the gate of the charge transfer device 320 to float. After the compensation device 325 is deactivated, the signal node 365 may be precharged a second time before a sense phase of the read operation begins. With the gate voltage of the charge transfer device 320 set and the memory cell 305 having dumped some or all of its charge onto the digit line 310, the sense phase may begin. To begin the sense phase, the isolation device 315 may be activated, thereby coupling the digit line 310 with the charge transfer device 320. The charge transfer device 320 may transfer a charge between the digit line 310 and the signal node 365 based on the state of the memory cell 305 and/or the gate voltage applied to the gate of the charge transfer device 320. The sense components 340 and 340-*a* may be configured to sense a signal on the signal node 365 after the charge is transferred. The state of the memory cell 305 may be determined based on the signal sensed at the signal node 365.

The read operation relies on the charge transfer device 320 to transfer varying amounts of charge between digit line and the signal node 365 based on the state stored on the memory cell 305. In order to transfer a charge to or from the signal node 365, a gate of the charge transfer device 320 may be biased to a first voltage. The first voltage may be equivalent to or may be based in part on a voltage of the digit line 310 plus the threshold voltage of the charge transfer device 320. In some cases, the first voltage may be equal to the precharge voltage of the digit line 310 and a threshold voltage of the charge transfer device 320. In some examples, the gate of the charge transfer device 320 may be biased to a first voltage based on a voltage being applied by the voltage source 375.

A memory device may include multiple charge transfer devices (e.g., for multiple digit lines). Because each charge transfer device may have a unique threshold voltage, having at least one compensation device 325 for each charge transfer device may allow for the gate voltage applied to the charge transfer device 320 to account for the unique threshold voltage. In this manner, a memory device may increase the uniformity of the read operation across the memory device even though threshold voltages may vary. In some cases, capacitor 330 may be configured to maintain the gate of the charge transfer device 320 at a fixed voltage (e.g., at a first voltage).

In order to conduct a sensing operation on memory cell 305, a gate of the charge transfer device 320 may be biased to a first voltage. The first voltage may be equivalent to or may be based in part on a precharge voltage of the digit line 310 plus the threshold voltage of the charge transfer device 320. The first voltage applied to the gate of the charge transfer device 320 may result in the charge transfer device 320 being activated based on a state stored on the memory cell 305. In some examples, the gate of the charge transfer device 320 may be biased to a first voltage based on a precharge voltage being applied to signal node 365. In some examples, the memory cell 305 may be discharged onto the digit line 310 after the first voltage is applied to the gate of the charge transfer device 320.

The compensation device 325 may be configured to apply a voltage to the gate of the charge transfer device 320 that compensates for a threshold voltage of the charge transfer device 320. As part of biasing the gate of the charge transfer device 320 to the first voltage, the voltage applied to signal node 365 may be removed and the isolation device 315 activated. In such cases, signal node 365 may be coupled with a precharged digit line 310. The voltage on the signal node 365 may relax to a voltage that is the precharge value of the digit line 310 plus the threshold voltage of the charge transfer device 320. After the first voltage is set, the compensation device 325 may be deactivated and the gate of the charge transfer device 320 may be caused to float. Capacitor 330 may help to maintain the gate of the charge transfer device 320 at a fixed voltage.

In some examples, the memory cell 305 may be discharged onto the digit line 310. Accordingly, by discharging the memory cell 305, the digit line 310 may be biased to a voltage (e.g., to a second voltage), which may be based on a logic state stored to the memory cell 305. For example, the digit line 310 may be biased to a different voltage if the memory cell 305 were to store a logic "1" state, then if the memory cell 305 were to store a logic "0" state.

The charge transfer device 320 may transfer the charge on the digit line 310 to the signal node 365 under certain conditions. Due to the charge transfer device 320 being activated (e.g., due to the first voltage applied to the gate), the charge from the memory cell 305 may be transferred to the sense component 340 if the second voltage is less than the first voltage. Because the charge across the digit line 310 and the resulting voltage applied to the gate of the charge transfer device 320 may be associated with a logic state of the memory cell 305, the charge transfer device 320 may activate to varying degrees based on a particular logic state being stored to the memory cell 305. In some cases, the degree to which the charge transfer device 320 is activated is based on the gate voltage applied to the charge transfer device 320 and the voltage applied to the source of the charge transfer device 320 (e.g., voltage on the digit line that is based on the logic state stored in the memory cell 305).

In a first example of the read operation, the compensation phase and the cell dump phase are performed serially; that is, the cell dump phase does not begin until the compensation phase is complete. To begin the compensation phase, a gate voltage may be applied to the gate of the charge transfer device 320. The value of the gate voltage applied to the charge transfer device 320 may affect the amount of charge transferred during the read operation. In some cases, the gate voltage may be set to be around the precharge voltage of the digit line 310 plus the threshold voltage of the charge transfer device 320. To bias the gate of the charge transfer device 320 to the first voltage (e.g., the gate voltage), the signal node 365 may be biased to a precharge voltage (e.g., a CT precharge voltage). During this time, the compensation device 325 may be activated such that the gate of the charge transfer device 320 is also biased to the precharge voltage. The digit line 310 may also be precharged to its precharge voltage (e.g., a DVC2 voltage). After the signal node 365 and the digit line 310 are precharged, the sense component 340-a may be isolated from the voltage source 375 by deactivating the transistor 377.

In addition, the isolation device 315 may be activated such that the signal node 365 and the digit line 310 are coupled through the charge transfer device 320 and the isolation device 315. Upon coupling the signal node 365 and the digit line 310, the signal node 365 may begin to discharge. Eventually, the voltage on the signal node 365 (and the gate of the charge transfer device 320) may discharge to the first voltage value that is approximately the precharge voltage of the digit line 310 (e.g., DVC2) plus the threshold voltage (e.g., Vth) of the charge transfer device 320 (e.g., DVC2+Vth). After the gate voltage of the charge transfer device 320 is set, the compensation device 325 may be deactivated, causing the gate of the charge transfer device 320 to float. In addition, the isolation device 315 may be deactivated thereby isolating the digit line 310 from the charge transfer device 320 before the cell dump phase of the read operation begins. The read operation may move onto other phases of the operation, including dumping the value stored in the memory cell 305 onto the digit line 310, transferring the charge between the digit line 310 and the signal node 365, and sensing the signal on the signal node 365.

During the cell dump phase, the transistor 385 may be activated thereby coupling the capacitor 390 of the memory cell 305 to the digit line 310. The memory cell 305 may then discharge its stored charge onto the digit line 310 thereby biasing the digit line 310 to a second voltage different than the precharge voltage.

During the cell dump phase, the signal node 365 may be precharged to a second precharge voltage (e.g., sense precharge voltage). In some cases, the second precharge voltage is different than the first precharge voltage. In some cases, the second precharge voltage is the same as the first precharge voltage. The second precharge voltage may be set at a level such that charge may be transferred between the signal node 365 and the digit line 310 during the sensing phase.

After the cell dump phase is complete, the sensing phase may begin by activating the isolation device 315. The digit line 310, biased to a second voltage, may be coupled with the signal node 365, biased to the second precharge voltage, by the charge transfer device 320. Based on the value of the first voltage applied to the gate of the charge transfer device 320 and the second voltage on the digit line 310, the charge transfer may transfer a varying amount of charge between the signal node 365 and the digit line 310. For example, if second voltage is much less than the first voltage, a large amount of charge may be transferred, or if the second voltage is slightly less than the first voltage, a smaller amount of charge may be transferred. The sense components 340 and 340-a may detect a signal (e.g., a charge) on the signal node 365 after the charge is transferred. A logic state stored to the memory cell 305 may be determined based on the signals sensed by the sense components 340 and 340-a. Additional details about the sense phase are described with reference to FIGS. 4 and 5.

In a second example of the read operation, the compensation phase and the cell dump phase are performed at least partially concurrently. Meaning that the cell dump phase begins before the compensation phase is complete. This is accomplished by using a different voltage source (e.g., voltage source 335) other than digit line 310 to apply the first voltage to the gate of the charge transfer device 320. In some cases, the gate voltage of the charge transfer device 320 may also be set at a value that is different than precharge voltage of the digit line 310 plus the threshold voltage of the charge transfer device 320.

Additionally or alternatively, the circuit 300 may include voltage source 335, which may be coupled with node 370 (e.g., via a transistor 337). In some examples, node 370 may be referred to as a node of the charge transfer device 320, and the voltage source 335 may be configured to apply a voltage to node 370 so that the compensation phase of the read operation may occur concurrently with the cell dump phase of the read operation. Said another way, the gate voltage of the charge transfer device 320 may be set using the voltage source 335 rather than the digit line 310 (biased to a precharge voltage, DVC2), thereby allowing another operation to occur on the digit line 310 while the gate of the charge transfer device 320 is being set. To bias the gate of the charge transfer device 320 using the voltage source 335, the signal node 365 may be biased to a precharge voltage. During this time, the compensation device 325 may be activated such that the gate of the charge transfer device 320 is also precharged to the precharge voltage. After the signal node 365 is biased to the precharge voltage, the voltage source 335 may be coupled to the node 370 using the transistor 337. The voltage may be applied when isolation device 315 is deactivated (e.g., is in an "off" position). The precharge voltage may cease being applied to the signal node 365 and the signal node 365 may discharge to a level that is the value of the voltage source 335 plus the voltage threshold of the charge transfer device 320. The value of the voltage source 335 may set to be the precharge voltage of the digit line 310 (e.g., DVC2) or a value around the precharge voltage of the digit line (e.g., DVC2±φ). The gate of the charge transfer device 320 may be biased to a first voltage at least partially concurrent with the memory cell 305 being discharged onto the digit line 310. After setting the gate voltage of the gate of the charge transfer device 320, the voltage source 335 may be isolated from the node 370 and/or the compensation device 325 may be deactivated.

After biasing the gate of the charge transfer device 320 (e.g., to a first voltage) using the voltage source 335, a cell dump phase may occur. During the cell dump phase, the transistor 385 may be activated thereby coupling the capacitor 390 of the memory cell 305 to the digit line 310. The memory cell 305 may then discharge its stored charge onto the digit line 310 thereby biasing the digit line 310 to a second voltage different than the precharge voltage. Before this occurs, the digit line 310 may be isolated from the voltage source 380 used to precharge the digit line by deactivating the transistor 387.

After the compensation phase but before the sensing phase, the signal node 365 may be precharged to a second precharge voltage (e.g., sense precharge voltage). In some cases, the second precharge voltage is different than the first precharge voltage. In some cases, the second precharge voltage is the same as the first precharge voltage. The second precharge voltage is set at a level such that charge may be transferred between the signal node 365 and the digit line 310 during the sensing phase.

After the cell dump phase is complete, the sensing phase may begin by activating the isolation device 315. The digit line 310, biased to a second voltage, may be coupled with the signal node 365, biased to the second precharge voltage, by the charge transfer device 320. Based on the value of the first voltage applied to the gate of the charge transfer device 320 and the second voltage on the digit line 310, the charge transfer may transfer a varying amount of charge between the signal node 365 and the digit line 310. For example, if the second voltage is much less than the first voltage, a large amount of charge may be transferred, or if the second voltage is slightly less than the first voltage, a smaller amount of charge may be transferred. The sense components 340 and 340-a may detect a signal (e.g., a voltage or charge) on the signal node 365 after the charge is transferred. A logic state stored on the memory cell 305 may be determined based on the signals sensed by the sense components 340 and 340-a. Additional details about the sense phase are described with reference to FIGS. 4 and 5.

During the sensing phase, the signal node 365 may begin to discharge based on the voltage on the digit line 310. The signal node 365 may discharge at different rates depending on the voltage on the digit line 310; e.g., depending on the state stored on memory cell 205. In some cases, the voltage on the digit line 310 means that the charge transfer device 320 does not transfer any charge or transfers very little charge (e.g., when the voltage on the digit line 310 is greater than the voltage on the gate of the charge transfer device 320). For example, if the memory cell 305 discharged a logic "0" value onto the digit line 310, the signal node 365 may discharge more quickly than, for example, if the memory cell 305 discharged a logic "1" value onto the digit line 310. Thus, by sensing the voltage value of the signal node 365 (e.g., by first sense component 340 and second sense component 340-a), a logic state of the memory cell 305 may be determined.

In some examples, first sense component 340 and second sense component 340-a may sense the signal at signal node 365 using a first reference value and second reference value (respectively) at different times (e.g., at a first time and at a second time). A transistor 345 (e.g., an isolation switch) may be activated (e.g., turned to an "on" position) such that first sense component 340 may receive the signal of the signal node 365. The first sense component 340 may conduct a sense operation by comparing the signal of the signal node 365 to reference voltage 350. This sense operation may occur at a first time.

In some examples, the transistor 345 may then be deactivated (e.g., turned to an "off" position) such that the signal of the signal node 365 may not be received by the first sense component 340. To conduct the second sense operation, transistor 345-a (e.g., an isolation switch) may be activated (e.g., turned to an "on" position) such that the second sense component 340-a may receive the signal of the signal node 365. The second sense component 340-a may then conduct a sense operation by comparing the signal at the signal node 365 to a second reference value received on reference line 355. In some examples, the transistor 345-a may then be deactivated (e.g., turned to an "off" position). This sense operation may occur, for example, at a second time different than (e.g., after) the first time. The resulting values of sensing the signal of the signal node 365 using the first sense component 340 and the second sense component 340-a may be used to determine the logic state of the memory cell 305.

Thus, reference selector 360 may be used to implement a "moving reference" to enable the first sense component 340 and second sense component 240-a to determine a state of a multi-level memory cell. Reference selector 360 is described in more detail with respect to FIG. 4.

Figure 4:
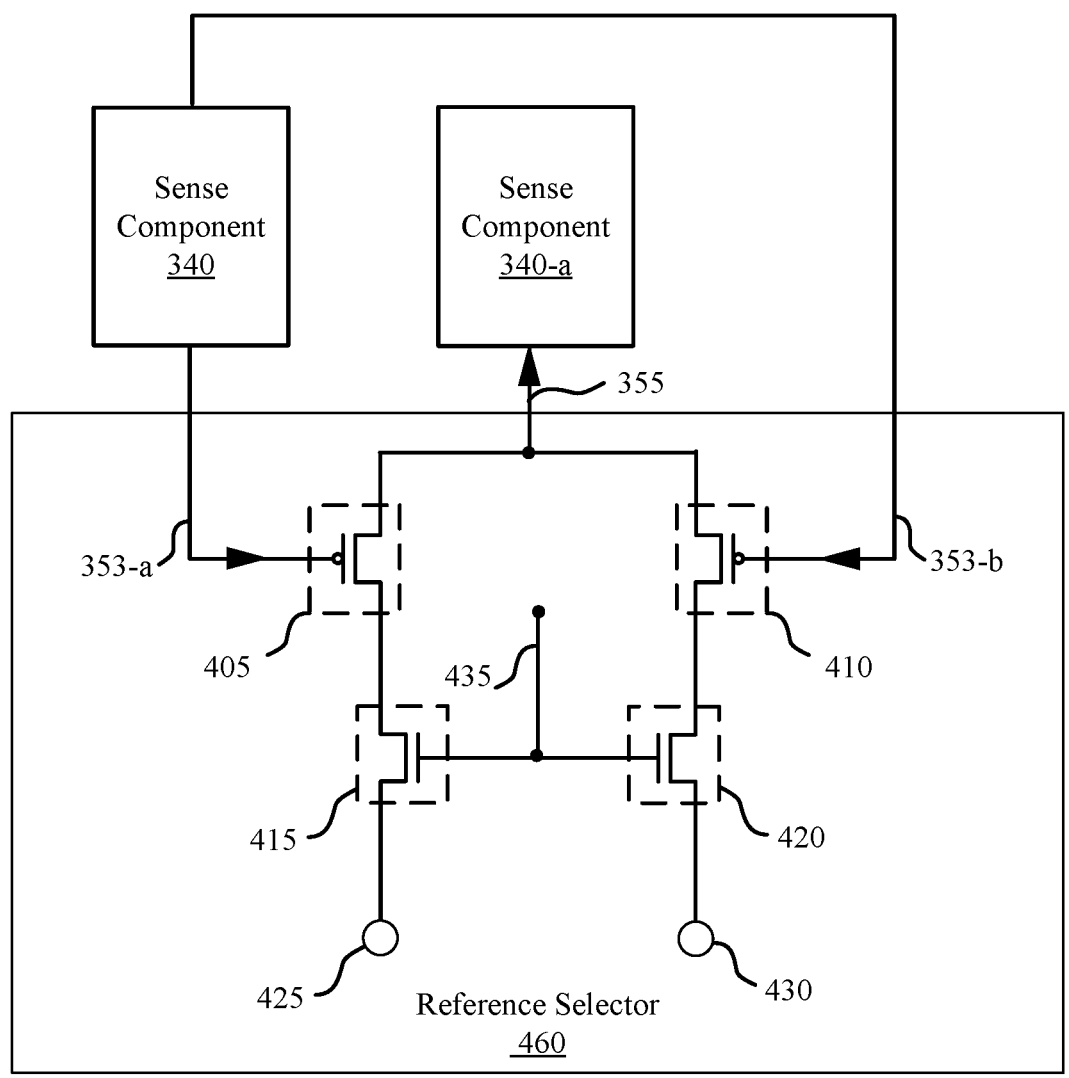
FIG. 4 illustrates an example circuit that supports sensing techniques using a moving reference in accordance with aspects of the present disclosure.

FIG. 4 illustrates an example circuit 400 that supports sensing techniques using a moving reference in accordance with aspects of the present disclosure. Circuit 400 includes sense components 340, 340-a as described with respect to FIG. 3. Circuit 400 includes reference selector 460, which may be an example of reference selector 360 described with respect to FIG. 3. Reference selector 460 includes transistors 405, 410, 415, 420 and voltage sources 425, 430. While voltage sources 425, 430 are depicted as being part of reference selector 460, in some cases they may be external to reference selector 460.

In some cases, reference selector 460 may be configured to receive outputs from first sense component 340 via output lines 353-a, 353-b and provide a second reference value to second sense component 340-a via second reference line 355. Output lines 353-a, 353-b may be an example of output line 353 described with respect to FIG. 3. Reference selector 460 may be configured to receive a strobe signal (e.g., from local memory controller 165, or from another source) via strobe line 435. A strobe signal may be a pulse or clock signal edge that activates transistors 415, 420 at a particular time. The transistors 415, 420 may be p-type transistors. In some cases, transistors 415, 420 may be n-type transistors.

In some cases, voltage source 425 may provide one value as a second reference value (such as a higher second reference value) and voltage source 430 may provide another value (different) as the second reference value (such as a lower second reference value), or vice versa. In some cases, a higher second reference value is a voltage that is greater than a voltage of the first reference value, and a lower second reference value is a voltage that is less than the voltage of the first reference value.

In some cases, reference selector 460 may be configured to select either the higher second reference value or the lower second reference value based on output signals received from sense component 340 via output lines 353-a, 353-b.

In some cases, output lines 353 include a true output line 353-a and a complement output line 353-b for communication of true and complement signals from sense component 340 to reference selector 460. In some cases, if a true signal is set to a voltage representing a logic "1," the complement signal may be set to a voltage representing a logic "0," and vice versa.

In some cases, the true and complement signals received by reference selector 460 via output lines 353-a, 353-b may represent the result of the comparison, by first sense component 340, of the signal with the first reference value. For example, if the comparison of the signal at signal node 365 with the first reference value determines that the signal is greater than the first reference value, the true signal may be set to (for example) a voltage representing a "1" and the complement signal may be set to a voltage representing a "0." If the comparison of the signal at signal node 365 with the first reference value determines that the signal is less than the first reference value, the true signal may be set to a voltage representing a "0" and the complement signal may be set to a voltage representing a "1." In some cases, the opposite signal polarity may be used to represent these two potential outcomes.

The true and complement signals received from sense component 340 (via output lines 353-*a*, 353-*b*) may each be coupled with a gate of a respective transistor 405, 410 and may activate the respective transistor 405, 410. In some cases, transistors 405, 410 may be the same type of transistor (e.g., p-type transistors). Because only one of the two output signals may exceed a gate threshold of the transistor 405, 410 after the comparison of the signal at the node with the first reference value, only one of the two transistors 405, 410 may be activated.

In some cases, reference selector 460 may be configured to receive a strobe signal via strobe line 435. Strobe line 435 may be coupled with the gates of transistors 415, 420, and may be used to activate transistors 415, 420. In some cases, when transistors 415, 420 are activated (e.g., when a strobe signal is applied to strobe line 435), and one of transistors 405, 410 is also activated (e.g., by one of the two output signals received via output lines 353-*a*, 353-*b*), then one of voltage source 425 or voltage source 430 may be coupled with second reference line 355 and thereby provide a second reference value to sense component 340-*a*. In some cases, the strobe signal may be activated (e.g., to activate transistors 415, 420) after or at the same time as one or transistors 405, 410 is activated.

Figure 5:
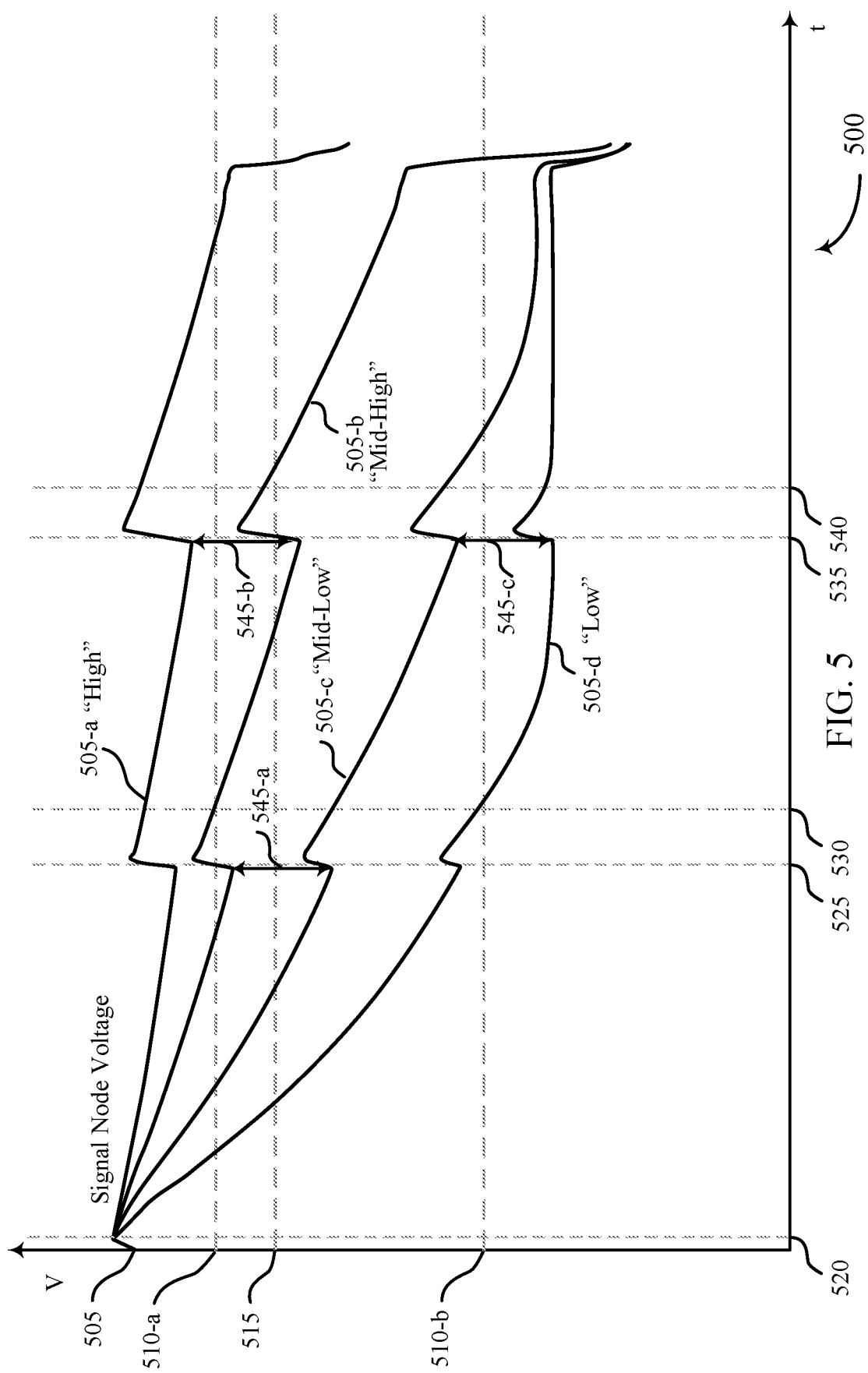
FIGS. 5 and 6 illustrate example timing diagrams that each support sensing techniques using a moving reference in accordance with aspects of the present disclosure.
Figure 6:
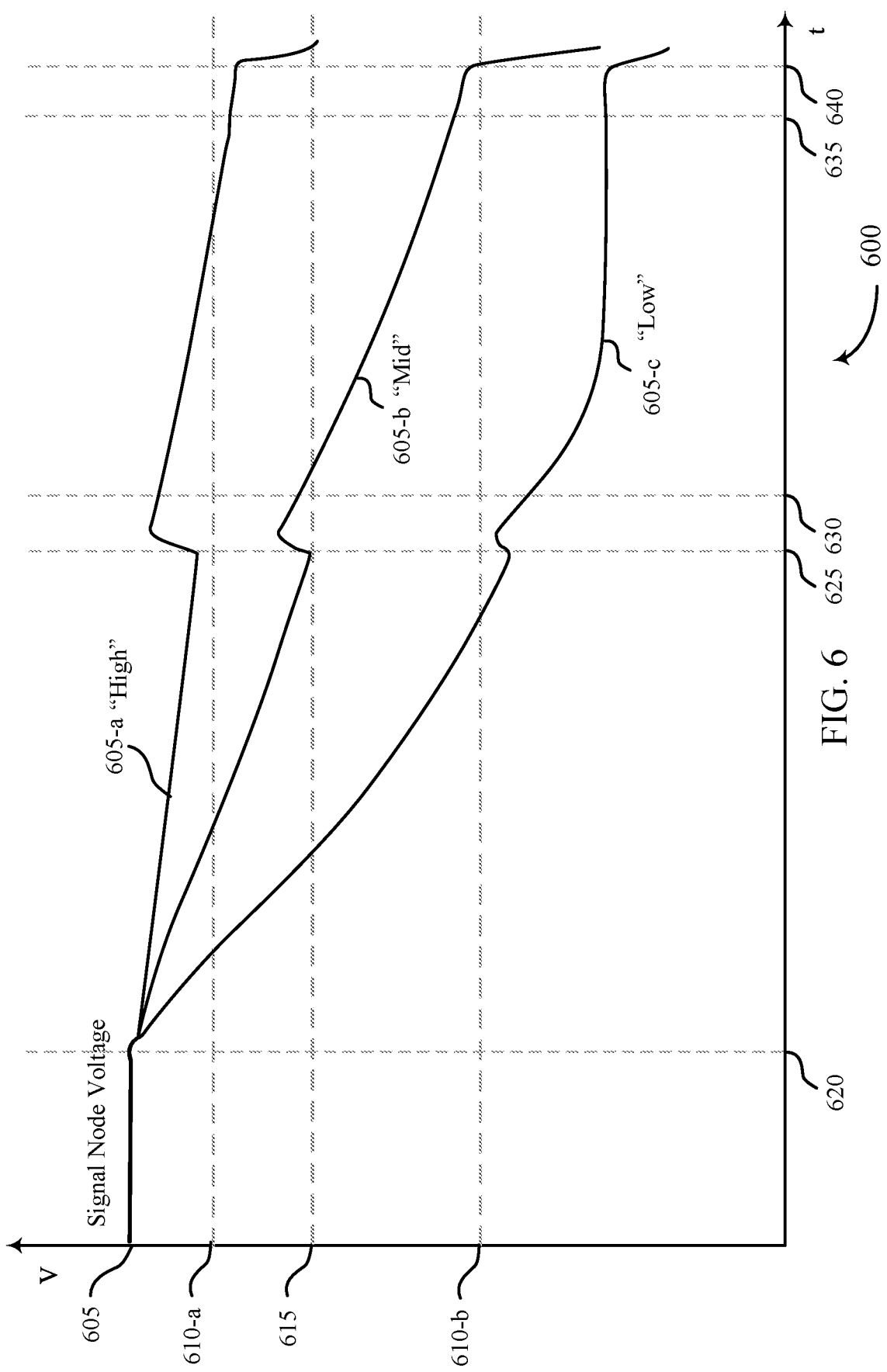

The operation and signal timing of circuit 400 for sensing a logic state of a multi-state memory cell using a moving reference is described in more detail with respect to FIGS. 5 and 6.

FIG. 5 illustrates an example timing diagram 500 that supports sensing techniques using a moving reference in accordance with aspects of the present disclosure. Timing diagram 500 illustrates the voltage behavior of the voltage at the signal node (e.g., at signal node 365 as described with reference to FIGS. 3-4) over time during a portion of a read operation of a memory cell that is configured to store one of four logic states.

The timing diagram 500 may illustrate operation of a circuit similar to the circuits 300, 400 described with reference to FIGS. 3-4. Thus, timing diagram 500 may illustrate the operation of one or more components described herein with reference to FIGS. 1-4. For example, timing diagram 500 may illustrate the voltage 505 of the signal node (e.g., signal node 365) as received by or applied to a first sense component (e.g., sense component 340 as described with reference to FIGS. 3-4) and/or a second sense component (e.g., sense component 340-*a* as described with reference to FIGS. 3-4) during a read operation of a memory cell.

In some examples, the four signal node voltages 505-*a*, 505-*b*, 505-*c*, 505-*d* depicted in FIG. 5 may illustrate different possible voltage behaviors based on the different states stored on the memory cell; that is, only one of the four signal node voltages 505-*a*, 505-*b*, 505-*c*, 505-*d* depicted in FIG. 5 may occur, depending on the logic state stored on the memory cell.

For a four-state (four-level) memory cell, the voltages 505-*a*, 505-*b*, 505-*c*, 505-*d* may represent the voltage behavior at the signal node during a read operation for a high-level state (e.g., 11), a mid-high-level state (e.g., 10), a mid-low-level state (e.g., 01), and a low-level state (e.g., 00) respectively. As shown in FIG. 5, the signal node voltage 505 associated with each of the states when the signal node voltage 505 is compared to the first reference value and/or the second reference value may be different for each of the logic states. For a multi-state memory cell, the voltages differences between the different voltage levels (e.g., representing different states) may be fairly small. Example voltages stored by a memory cell that may correspond to four such logic states are depicted in Table 1. Such voltages are depicted for illustrative purposes only and should not be interpreted as limiting. In some cases, each state may be associated with a range of voltages rather than a discrete voltage value.

| | |
|---|---|
| High level (e.g., 11) | 850 mV |
| Mid-high level (e.g., 10) | 600 mV |
| Mid-low level (e.g., 01) | 350 mV |
| Low level (e.g., 00) | 100 mV |

Table 1: Example voltages associated with logic states for a four-state memory cell Timing diagram 500 depicts first reference voltage 515, higher second reference voltage 510-*a*, and lower second reference voltage 510-*b*. First reference voltage 515 may be an example of a first reference value as described with respect to FIGS. 1-4. Higher second reference voltage 510-*a* and lower second reference voltage 510-*b* may each be an example of a second reference value as described with respect to FIGS. 1-4.

In general, during the read operation, a first sense component (e.g., sense component 340) may compare the signal node voltage (e.g., the voltage at signal node 365) with the first reference voltage 515 and provide an output indicating the result of the comparison to a reference selector (e.g., reference selector 360). The reference selector may then select either the higher second reference voltage 510-*a* or the lower second reference voltage 510-*b* based on the comparison and provide the selected second reference voltage to a second sense component (e.g., sense component 340-*a*). The second sense component may then compare the signal node voltage 505 with the selected second reference voltage. The logic state of the memory cell (e.g., high, mid-high, mid-low, or low) may be determined based on one or both of the comparisons. Additional operational and timing details are described below.

In some cases, a signal node (e.g., signal node 365 as described with reference to FIG. 3) that is coupled with the charge transfer device (e.g., charge transfer device 320 as described with reference to FIG. 3) may be precharged to a first voltage at the initiation of the read operation, e.g., before the memory cell is coupled with the digit line. For example, the signal node may be precharged by a voltage source coupled with the node and a compensation device. In some examples, the signal node may be precharged to a precharge voltage Vp, as indicated in FIG. 5. The precharge voltage Vp may be 1.2 volts, 1.3 volts, 1.4 volts, 1.5 volts, or another voltage, for example. Thus, signal node voltage 505 may be set to precharge voltage Vp at or before the initiation of a read operation.

After precharging the signal node, a compensation operation may occur to set a gate voltage for the charge transfer device, and a memory cell (e.g., memory cell 305 as described with reference to FIG. 3) may be coupled with a digit line (e.g., digit line 310 as described with reference to FIG. 3). The signal node may then begin to transfer charge with the memory cell (via the digit line). Accordingly, the voltage on the signal node may change from the precharge value (Vp) to a value that corresponds to the voltage on the digit line, which is based on the logic state stored to the memory cell. For example, voltage 505-a may correspond to the voltage on the signal node that occurs during a transfer of charge with the digit line when the memory cell stores a first state (e.g., a high state). Other voltages 505-b, 505-c, 505-d correspond to the voltages on the signal node that occur during a transfer of charge with the digit line when the memory cell stores one of the other states. Additional operational and timing details are described below.

At time 520, the signal node may be coupled with the digit line. In some examples, this may initiate a sense phase of the read operation. To couple the signal node with the digit line and with the first and second sense components, the isolation device (e.g., isolation device 315 described with reference to FIG. 3) may be activated. The signal node voltage 505 may begin to discharge (e.g., may decrease relative to the precharge voltage) based on the voltage on the digit line (e.g., based on the state stored on the memory cell). In some examples, the rate at which the node discharges may correspond to the state stored on the memory cell. If a charge transfer device is used to transfer a charge from the digit line to the signal node, the signal node may discharge at a different (e.g., a faster) rate.

At time 525, an isolation switch (e.g., isolation switch 345) may be de-activated (e.g., opened) to isolate the first sense component from the signal node. In some cases, the isolation switch may be deactivated by the local memory controller 165 or by another controller, for example.

At time 530, the first sense component may compare the signal node voltage 505 (e.g., the voltage at signal node 365) with the first reference voltage 515 to distinguish between the two higher logic states (e.g., high and mid-high) and the two lower logic states (e.g., mid-low and low). The first reference voltage 515 may be a voltage that is between the expected voltage levels associated with the mid-high state and the mid-low state at time 525. By way of example, assuming the expected signal node voltage 505 associated with the mid-high state (e.g., signal node voltage 505-b) at this point in the read operation is approximately 1.0 V and the expected signal node voltage 505 associated with the mid-low state (e.g., signal node voltage 505-c) at this point of the read operation is approximately 650 mV, the first reference voltage may be a voltage of approximately 800 mV. The comparison may occur any time after time 525 when the first sense component is isolated from the signal node.

Based on the outcome of this comparison, the first sense component may provide true and complement output signals (e.g., via output lines 353-a, 535-b) to a reference selector (e.g., reference selector 360). Such output signals (not shown) may activate one of two transistors in reference selector (e.g., transistors 405, 410) such that reference selector may select either the higher second reference voltage 510-a (e.g., provided by voltage source 425) or the lower second reference voltage 510-b (e.g., provided by voltage source 430). The reference selector may subsequently receive a strobe signal (e.g., on strobe line 435) that activates two additional transistors (e.g., transistors 415, 420) to couple the selected voltage source (e.g., voltage source 425 or 430) with the second sense component (e.g., via second reference line 355) and provide the selected second reference value 510-a, 510-b to the second sense component.

A duration may elapse between a first sense operation and a second sense operation. In some cases, such a duration may allow the voltage of the second reference line to settle after the second reference value is selected. During this duration, the signal on the signal node may continue to discharge or settle. In some cases, the duration may depend on which second reference value was selected. For example, if the second reference line is precharged to the higher second reference value, and the higher second reference value is selected, then the duration may be shorter than if the lower second reference value is selected since it may take less time for the signal or the second reference line to settle after the second reference value is selected. In some cases, the duration may be a fixed amount of time that does not depend on which second reference value is selected.

In some cases, at time 535, an isolation switch (e.g., isolation switch 345-a) coupled with the second sense component may be deactivated. This may isolate the second sense component from the signal node, such that the voltage of the signal node may be sensed by the second sense component during a second sense operation.

At time 540, the second sense component may compare the signal node voltage 505 (e.g., the voltage at signal node 365) with the selected second reference voltage 510-a, 510-b to distinguish between the two higher logic states (e.g., high and mid-high) or between the two lower logic states (e.g., mid-low and low). The second reference voltage 510-a, 510-b may be a voltage that is between the expected voltage levels associated with either the high and mid-high states or the mid-low and low logic states. Based on the outcome of this comparison, the second sense component may determine at least a portion of the logic state of the memory cell. The comparison may occur any time after time 535 when the second sense component is isolated from the signal node.

In some cases, the second reference line may be biased to an initial voltage prior to selecting the second reference voltage or applying the second reference voltage to the second reference line (e.g., prior to time 530). For example, the second reference line may be biased to an initial voltage that is approximately mid-way between the higher second reference voltage 510-a and the lower second reference voltage 510-b such that, when the second line is coupled with the selected second reference voltage, the change in the voltage of the second reference line is relatively small. In some cases, this initial voltage may be substantially equivalent to the first reference voltage. Alternatively, the second reference line may be biased to an initial voltage that is approximately equal to either the higher second reference voltage or the lower second reference voltage, such that in some cases (depending on which second reference voltage is selected), there may be essentially no change in the voltage of the second reference line, and thus essentially no noise introduced into the signal or the second reference voltage. The tradeoff in this case is that, in the alternative case when the second reference line must change to the other second reference voltage, the larger voltage change may introduce a larger amount of noise relative to the case when the second reference line is initially biased to a voltage between the two possible second reference voltages. In some cases, to reduce the amount of noise introduced into the signal node voltage 505 and/or the second reference voltage 510-a, 510-b by the change in the voltage of the second reference line when the second reference voltage 510-a, 510-b is selected and applied to the second reference line, the second reference line may be set to one of these initial voltages.

By implementing a charge transfer device, the sensing window 545-a associated with the first sensing operation and/or the sensing windows 545-b, 545-c associated with the second sensing operation may be improved. Thus a more accurate read operation may be performed using the larger sense window.

In some examples, a logic state of the memory cell may be determined based on each of the first sense operation and the second sense operation. For example, the first sense component may compare signal node voltage 505 with the first reference voltage 515. Based on a difference between the voltages, the first sense component may determine a "1" or a "0" value, which may be, for example, the value of a first bit in a two-bit state. Thus, first sense component may determine a first portion of the logic state. Subsequently, the second sense component may compare the signal node voltage 505 with the selected second reference voltage 510-*a* or 510-*b* and, based on the difference between the voltages, may determine a 1 or a 0 value, which may be a value of a second bit in the two-bit state. Thus, second sense component may determine a second portion of the logic state. Based on the results of each of the two sense operations, the logic state of the memory cell may be determined to be a logic state 00, 01, 10, or 11, for example.

FIG. 6 illustrates an example timing diagram 600 that supports sensing techniques using a moving reference in accordance with aspects of the present disclosure. Timing diagram 600 illustrates the voltage behavior of the voltage at the signal node (e.g., at signal node 365 as described with reference to FIGS. 3-4) over time during a portion of a read operation of a memory cell that is configured to store one of three logic states (rather than one of four logic states, as described with respect to FIG. 5).

The timing diagram 600 may illustrate operation of a circuit similar to the circuits 300, 400 described with reference to FIGS. 3-4. Thus, timing diagram 600 may illustrate the operation of one or more components described above with reference to FIGS. 1-4. For example, timing diagram 600 may illustrate the voltage 605 of the signal node (e.g., signal node 365) as received by or applied to a first sense component (e.g., sense component 340 as described with reference to FIGS. 3-4) and/or a second sense component (e.g., sense component 340-*a* as described with reference to FIGS. 3-4) during a read operation of a memory cell.

In some examples, the three signal node voltages 605-*a*, 605-*b*, 605-*c* depicted in FIG. 6 may illustrate different possible voltage behaviors based on the different states stored on the memory cell; that is, only one of the three signal node voltages 605-*a*, 605-*b*, 605-*c* depicted in FIG. 6 may occur, depending on the logic state stored on the memory cell.

For a three-state (three-level) memory cell, the voltages 605-*a*, 605-*b*, 605-*c* may represent the voltage behavior at the signal node during a read operation for a high-level state (e.g., 1), a mid-level state (e.g., mid) and a low-level state (e.g., 0) respectively. As shown in FIG. 6, the signal node voltage 605 associated with each of the states when the signal node voltage 605 is compared to the first reference value and/or the second reference value may be different for each of the logic states. For a multi-state memory cell, the voltage differences between the different voltage levels (e.g., representing different states) may be fairly small. Example voltages stored on a memory cell that may correspond to three such logic states are depicted in Table 2. Such voltages are depicted for illustrative purposes only and should not be interpreted as limiting. In some cases, each state may be associated with a range of voltages rather than a discrete voltage value.

| | |
|---|---|
| High-level (e.g., 0) | 800 mV |
| Mid-level (e.g., "mid") | 500 mV |
| Low level (e.g., 1) | 200 mV |

Table 1: Example voltages associated with logic states for a three-state memory cell Timing diagram 600 depicts first reference voltage 615, higher second reference voltage 610-*a*, and lower second reference voltage 610-*b*. First reference voltage 615 may be an example of a first reference value as described with respect to FIGS. 1-4. Higher second reference voltage 610-*a* and lower second reference voltage 610-*b* may each be an example of a second reference value as described with respect to FIGS. 1-4.

In general, as described with respect to FIG. 5, a first sense component (e.g., sense component 340) may compare the signal node voltage (e.g., the voltage at signal node 365) with the first reference voltage 615 and provide an output indicating the result of the comparison to a reference selector (e.g., reference selector 360). The reference selector may then select either the higher second reference voltage 610-*a* or the lower second reference voltage 610-*b* based on the comparison and provide the selected second reference voltage to a second sense component (e.g., sense component 340-*a*). The second sense component may then compare the signal node voltage 605 with the selected second reference voltage. The logic state of the three-state memory cell (e.g., high, mid, or low) may be determined based on one or both of the comparisons. As described in the case of FIG. 5, a charge transfer device may be used to improve a sense window associated with the sense operations. Additional operational and timing details are described below.

At time 620, the signal node may be coupled with the digit line. In some examples, this may initiate a sense phase of the read operation. To couple the signal node with the digit line and with the first and second sense components, the isolation device (e.g., isolation device 315 described with reference to FIG. 3) may be activated. The signal node voltage 605, which may have been precharged as described with respect to FIG. 5, may begin to discharge (e.g., may decrease relative to the pre-charge voltage) based on the voltage on the digit line (e.g., based on the state stored on the memory cell).

At time 625, an isolation switch (e.g., isolation switch 345) may be de-activated (e.g., opened) to isolate the first sense component from the signal node. In some cases, the isolation switch may be deactivated by the local memory controller 165 or by another controller, for example.

At time 630, the first sense component may compare the signal node voltage 605 (e.g., the voltage at signal node 365) with the first reference voltage 615 to distinguish between the high logic states and the low logic state. The first reference voltage 615 may be a voltage that is between the expected voltage levels associated with the high state and the low state at time 630. By way of example, assuming the expected signal node voltage 605 associated with the high state (e.g., signal node voltage 605-*a*) at this point in the read operation is approximately 1. V and the expected signal node voltage 605 associated with the low state (e.g., signal node voltage 605-*c*) at this point of the read operation is approximately 650 mV, the first reference voltage may be a voltage of approximately 800 mV. The comparison may occur any time after time 625 when the first sense component is isolated from the signal node.

Based on the outcome of this comparison, the first sense component may provide true and complement output signals (e.g., via output lines 353-a, 535-b) to a reference selector (e.g., reference selector 360) to activate one of two transistors in reference selector (e.g., transistors 405, 410) such that reference selector may select either the higher second reference voltage 610-a (e.g., provided by voltage source 425) or the lower second reference voltage 610-b (e.g., provided by voltage source 430). The reference selector may subsequently receive a strobe signal (e.g., on strobe line 435) that activates two additional transistors (e.g., transistors 415, 420) to couple the selected voltage source (e.g., voltage source 425 or 430) with the second sense component (e.g., via second reference line 355) and provide the selected second reference value 610-a, 610-b to the second sense component.

A duration may pass between a first sense operation and a second sense operation. At time 635, an isolation switch coupled with the second sense component may be deactivated. This may isolate the second sense component and from the signal node, such that the voltage of the signal node may be sensed by the second sense component during a second sense operation. In addition, during this duration, the signal on the signal node may continue to discharge.

At time 640, the second sense component may compare the signal node voltage 605 (e.g., the voltage at signal node 365) with the selected second reference voltage 610-a, 610-b to distinguish between the mid-state and the high state or the mid-state and the low state (depending on which second reference voltage was selected). The second reference voltage 610-a, 610-b may be a voltage that is between the expected voltage levels associated with either the high and mid states or the mid and low logic states. Based on the outcome of this comparison, the second sense component may determine at least a portion of the logic state of the memory cell. The comparison may occur any time after time 635 when the second sense component is isolated from the signal node. In some cases, the second sense component may not be isolated from the signal node when the comparison occurs. In such cases, the comparison may occur while the signal node is coupled with the second sense components. Such cases may occur when the sense component is the last sense component to be activated during a read operation. After the last sense component is activated and performs the comparison, the read operation may be complete and maintaining the signal on the sense node may not be as necessary.

Similar to the case described with respect to FIG. 5, the second reference line may be biased to an initial voltage prior to selecting the second reference voltage or applying the second reference voltage to the second reference line (e.g., prior to time 630). For example, the second reference line may be biased to an initial voltage that is approximately mid-way between the higher second reference voltage 610-a and the lower second reference voltage 610-b such that, when the second line is coupled with the selected second reference voltage, the change in the voltage of the second reference line is relatively small. In some cases, this initial voltage may be substantially equivalent to the first reference voltage. Alternatively, the second reference line may be biased to an initial voltage that is approximately equal to either the higher second reference voltage or the lower second reference voltage, such that in some cases (depending on which second reference voltage is selected), there may be essentially no change in the voltage of the second reference line, and thus essentially no noise introduced into the signal or the second reference voltage. The tradeoff in this case is that, in the alternative case when the second reference line must change to the other second reference voltage, the larger voltage change may introduce a larger amount of noise relative to the case when the second reference line is initially biased to a voltage between the two possible second reference voltages.

In some examples, a logic state of the memory cell may be determined based on each of the first sense operation and the second sense operation. Based on a difference between the voltages, the first sense component may determine that the logic state is one of either a 1 or a mid, or one of either a mid or a 0. Thus, first sense component may determine a first portion of the logic state. Subsequently, the second sense component may compare the signal on the node with the selected second reference voltage 610-a, 610-b and, based on the difference between the voltages, may determine one of the two candidate logic states. Thus, second sense component may determine a second portion of the logic state. Based on the results of each of the two sense operations, the logic state of the three-state memory cell may be determined to be a logic state 0, mid, or 1.

Figure 7:
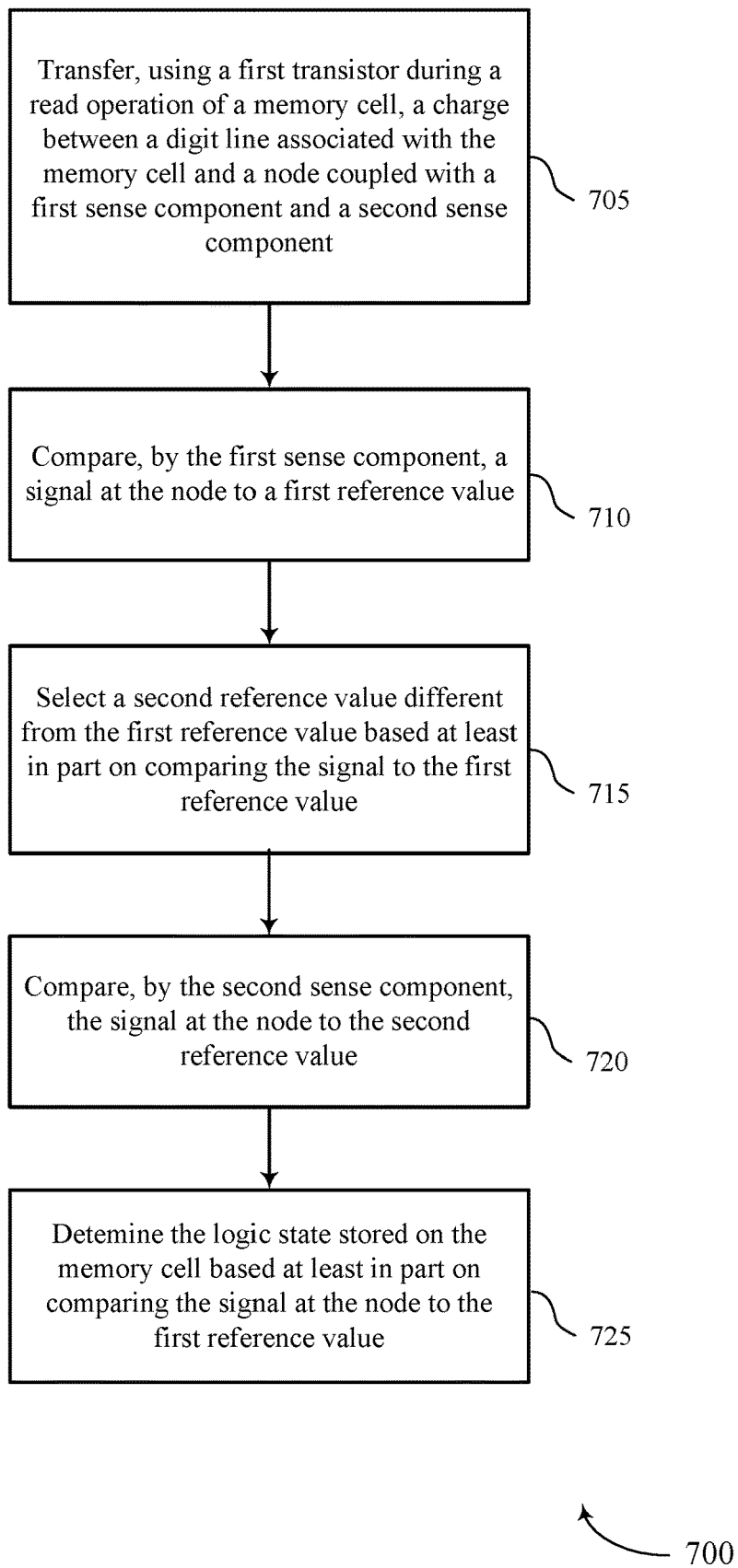
FIG. 7 shows a flowchart illustrating a method that supports sensing techniques using a moving reference in accordance with aspects of the present disclosure.

FIG. 7 shows a flowchart illustrating a method 700 that supports sensing techniques using a moving reference in accordance with aspects of the present disclosure. The operations of method 700 may be implemented by a controller or its components as described herein. For example, the operations of method 700 may be performed by a controller as described with reference to FIG. 1. In some examples, a memory device may execute a set of instructions to control the functional elements of the memory device to perform the functions described below. Additionally or alternatively, a memory device may perform aspects of the functions described below using special-purpose hardware.

At 705, a charge may be transferred, using a first transistor during a read operation of a memory cell, between a digit line associated with the memory cell and a node coupled with a first sense component and a second sense component. In some examples, aspects of the operations of 705 may be performed by a charge transfer component as described with reference to FIGS. 5 and 6.

At 710, a signal on the node may compared, by the first sense component, with a first reference value. In some examples, aspects of the operations of 710 may be performed by a sensing component as described with reference to FIGS. 5-6.

At 715, a second reference value different than the first reference value may be selected based at least in part on comparing the signal at the node to the first reference value. In some examples, aspects of the operations of 715 may be performed by a sensing component as described with reference to FIGS. 5-6.

At 720, a signal on the node may compared, by a second sense component, with the second reference value. In some examples, aspects of the operations of 720 may be performed by a sensing component as described with reference to FIGS. 5-6.

At 725, a logic state of a multi-level memory cell may be determined based at least in part on comparing the signal at the node with the first reference value. In some examples, aspects of the operations of 725 may be performed by a local memory controller (e.g., local memory controller 165).

It should be noted that the method described above describes possible implementations, and that the operations and the steps may be rearranged or otherwise modified and that other implementations are possible.

A method is described. In some examples, the method may include transferring, using a first transistor during a read operation of a memory cell, a charge between a digit line associated with the memory cell and a node coupled with a first sense component and a second sense component; comparing, by the first sense component, a signal at the node to a first reference value; selecting a second reference value different from the first reference value based at least in part on comparing the signal to the first reference value; comparing, by the second sense component, the signal at the node to the selected second reference value; and determining a logic state stored on the memory cell based at least in part on comparing the signal at the node to the second reference value.

In some examples, determining the logic state stored on the memory cell may include determining the logic state based at least in part on comparing the signal at the node to the first reference value.

In some examples, the method may include isolating, before comparing the signal at the node to the first reference value, the first sense component from the second sense component and from the node during at least a portion of the read operation.

In some examples, the second reference value is selected from a group including a higher second reference value greater than the first reference value and a lower second reference value less than the first reference value.

In some examples, the method may include determining, based at least in part on comparing the signal at the node to the first reference value, whether the signal at the node is greater than the first reference value, and selecting the second reference value includes selecting, based on a determination that the signal at the node is greater than the first reference value, the higher second reference value, and selecting, based on a determination that the signal at the node is less than the first reference value, the lower second reference value.

In some examples, the memory cell is configured to store one of four or more logic states, and the lower second reference value is a voltage between a first voltage associated with a first logic state and a second voltage associated with a second logic state. The higher second reference value is a voltage between a third voltage associated with a third logic state and a fourth voltage associated with a fourth logic state.

In some examples, the memory cell is configured to store one of three logic states, and the lower second reference value is a voltage between a first voltage associated with a first logic state and a second voltage associated with a second logic state. The higher second reference value is a voltage between the second voltage associated with the second logic state and a third voltage associated with a third logic state.

In some examples, the method includes biasing, before selecting the second reference value, a reference line associated with the second sense component to an initial value that is equal to the higher second reference value or the lower second reference value, where selecting the second reference value sets the reference line to the second reference value for comparing the signal at the node with the second reference value.

In some examples, the method includes biasing, before selecting the second reference value, a reference signal associated with the second sense component to an initial value that is between the higher second reference value and the lower second reference value, where selecting the second reference value sets the reference signal to the second reference value for comparing the signal at the node with the second reference value.

In some examples, the method includes biasing, before selecting the second reference value, a reference signal associated with the second sense component to an initial value that is equal to the first reference value, where selecting the second reference value sets the reference signal to the second reference value for comparing the signal at the node with the second reference value.

In some examples, the method includes determining that a duration has elapsed after comparing the signal at the node to the first reference value, where comparing the signal at the node to the second reference value is based at least in part on the determination that the duration has elapsed.

In some examples, transferring the charge is based at least in part on a first voltage on the digit line being less than a second voltage on a gate of the first transistor.

An apparatus is described. In some examples, the apparatus may support means for transferring, using a first transistor during a read operation of a memory cell, a charge between a digit line associated with the memory cell and a node coupled with a first sense component and a second sense component; comparing, by the first sense component, a signal at the node to a first reference value; selecting a second reference value different from the first reference value based at least in part on comparing the signal to the first reference value; comparing, by the second sense component, the signal at the node to the selected second reference value; and determining a logic state stored on the memory cell based at least in part on comparing the signal at the node to the second reference value.

In some examples, the apparatus may support means for determining the logic state stored on the memory cell may include determining the logic state based at least in part on comparing the signal at the node to the first reference value.

In some examples, the apparatus may support means for isolating, before comparing the signal at the node to the first reference value, the first sense component from the second sense component and from the node during at least a portion of the read operation.

In some examples, the second reference value is selected from a group including a higher second reference value greater than the first reference value and a lower second reference value less than the first reference value.

In some examples, the apparatus may support means for determining, based at least in part on comparing the signal at the node to the first reference value, whether the signal at the node is greater than the first reference value, and selecting the second reference value includes selecting, based on a determination that the signal at the node is greater than the first reference value, the higher second reference value, and selecting, based on a determination that the signal at the node is less than the first reference value, the lower second reference value.

In some examples, the memory cell is configured to store one of four or more logic states, and the lower second reference value is a voltage between a first voltage associated with a first logic state and a second voltage associated with a second logic state. The higher second reference value is a voltage between a third voltage associated with a third logic state and a fourth voltage associated with a fourth logic state.

In some examples, the memory cell is configured to store one of three logic states, and the lower second reference value is a voltage between a first voltage associated with a first logic state and a second voltage associated with a second logic state. The higher second reference value is a voltage between the second voltage associated with the second logic state and a third voltage associated with a third logic state.

In some examples, the apparatus may support means for biasing, before selecting the second reference value, a reference line associated with the second sense component to an initial value that is equal to the higher second reference value or the lower second reference value, where selecting the second reference value sets the reference line to the second reference value for comparing the signal at the node with the second reference value.

In some examples, the apparatus may support means for biasing, before selecting the second reference value, a reference signal associated with the second sense component to an initial value that is between the higher second reference value and the lower second reference value, where selecting the second reference value sets the reference signal to the second reference value for comparing the signal at the node with the second reference value.

In some examples, the apparatus may support means for biasing, before selecting the second reference value, a reference signal associated with the second sense component to an initial value that is equal to the first reference value, where selecting the second reference value sets the reference signal to the second reference value for comparing the signal at the node with the second reference value.

In some examples, the apparatus may support means for determining that a duration has elapsed after comparing the signal at the node to the first reference value, where comparing the signal at the node to the second reference value is based at least in part on the determination that the duration has elapsed.

In some examples, transferring the charge is based at least in part on a first voltage on the digit line being less than a second voltage on a gate of the first transistor.

An apparatus is described. In some examples, the apparatus may include a memory cell coupled with a digit line and configured to store one of three or more logic states; a transistor coupled with the digit line and a node, the transistor configured to transfer a charge between the digit line and the node during a read operation of the memory cell; a first sense component coupled with the node and configured to compare a signal at the node with a first reference value based at least in part on the charge transferred between the digit line and the node; a reference selector component coupled with the first sense component and configured to select, based on the comparison of the signal at the node with the first reference value, a second reference value different than the first reference value; and a second sense component coupled with the node and the reference selector component and configured to compare the signal at the node with the selected second reference value to determine a logic state stored on the memory cell.

In some examples, the apparatus may include an isolation component coupled with the node and configured to isolate the second sense component from the first sense component and from the node during a portion of the read operation.

In some examples, the reference selector component includes a first voltage source configured to provide a higher second reference value that is greater than the first reference value, and a second voltage source configured to provide a lower second reference value that is less than the first reference value, where the second reference value is selected from a group comprising the higher second reference value and the lower second reference value.

In some examples, the reference selector component includes a second transistor configured to selectively couple the first voltage source with the second sense component based at least in part on being activated by an output of the first sense component, where the output is based at least in part on the comparison of the signal with the first reference value; and a third transistor configured to selectively couple the second voltage source with the second sense component based at least in part on being activated by a complement of the output.

In some examples, the apparatus includes a fourth transistor configured to selectively couple the second transistor with the first voltage source based at least in part on a strobe signal; and a fifth transistor configured to selectively couple the third transistor with the second voltage source based at least in part on the strobe signal.

In some example, the apparatus may include a third voltage source coupled with a reference line of the second sense component, the third voltage source configured to bias, before the second reference value is selected, the reference line to an initial value equal to the higher second reference value or to the lower second reference value, where the second sense component is configured to compare the signal at the node with the second reference value by comparing the signal at the node with a signal at the reference line.

In some example, the apparatus may include a third voltage source coupled with a reference line of the second sense component, the third voltage source configured to bias, before the second reference value is selected, the reference line to an initial value between the higher second reference value and the lower second reference value, where the second sense component is configured to compare the signal at the node with the second reference value by comparing the signal at the node with a signal at the reference line.

In some examples, the transistor is configured to transfer the charge between the digit line and the node based at least in part on a voltage of the digit line being less than a voltage on a gate of the transistor during the read operation.

A memory device is described. In some examples, the memory device may include a memory cell coupled with a digit line and configured to store one of three or more logic states; a first sense component coupled with a node; a second sense component coupled with the node; a reference selector component coupled with the first sense component and the second sense component; a transistor coupled with the node; and a controller coupled with the memory cell, the controller operable to cause the memory device to: transfer, with the transistor, a charge between the digit line and the node during a read operation of the memory cell; compare, with the first sense component, a signal at the node to a first reference value; select, with the reference selector component, a second reference value based at least in part on the comparison of the signal at the node to the first reference value, where the reference selector component is configured to select the second reference value from a group comprising a higher second reference value greater than the first reference value and a lower second reference value less than the first reference value; compare, with the second sense component, the signal at the node to the selected second reference value; and determine, with the second sense component, at least a first bit associated with a logic state stored on the memory cell based at least in part on the comparison of the signal at the node to the selected second reference value.

In some examples, the controller is further operable to cause the memory device to determine, with the first sense component and based at least in part on the comparison of the signal at the node to the first reference value, whether the signal at the node is greater than the first reference value; and select, with the reference selector component, the second reference value based at least on the determination.

In some examples, the reference selector component is configured to select, based at least on a determination that the signal at the node is greater than the first reference value, the higher second reference value, and select, based at least on a determination that the signal at the node is less than the first reference value, the lower second reference value.

In some examples, the controller is further operable to cause the memory device to isolate, with an isolation component coupled with the first sense component and the second sense component, the first sense component from the second sense component during a portion of the read operation.

In some examples, the controller is further operable to cause the memory device to determine, with the first sense component, at least a second bit associated with the logic state based at least in part on the comparison of the signal at the node to the first reference value.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    transferring, using a first transistor during a read operation of a memory cell, a charge between a digit line associated with the memory cell and a node coupled with a first sense component and a second sense component;
    comparing, by the first sense component, a signal at the node to a first reference value;
    selecting a second reference value different from the first reference value based at least in part on comparing the signal to the first reference value;
    comparing, by the second sense component, the signal at the node to the selected second reference value; and
    determining a logic state stored on the memory cell based at least in part on comparing the signal at the node to the second reference value.

2. The method of claim 1, wherein determining the logic state stored on the memory cell comprises:
    determining the logic state based at least in part on comparing the signal at the node to the first reference value.

3. The method of claim 1, further comprising:
    isolating, before comparing the signal at the node to the first reference value, the first sense component from the second sense component and from the node during at least a portion of the read operation.

4. The method of claim 1, wherein the second reference value is selected from a group comprising a higher second reference value greater than the first reference value and a lower second reference value less than the first reference value.

5. The method of claim 4, further comprising:
    determining, based at least in part on comparing the signal at the node to the first reference value, whether the signal at the node is greater than the first reference value, and wherein selecting the second reference value comprises:
        selecting, based on a determination that the signal at the node is greater than the first reference value, the higher second reference value, and
        selecting, based on a determination that the signal at the node is less than the first reference value, the lower second reference value.

6. The method of claim 4, wherein:
    the memory cell is configured to store one of four or more logic states;
    the lower second reference value comprises a voltage between a first voltage associated with a first logic state and a second voltage associated with a second logic state; and
    the higher second reference value comprises a voltage between a third voltage associated with a third logic state and a fourth voltage associated with a fourth logic state.

7. The method of claim 4, wherein:
    the memory cell is configured to store one of three logic states;
    the lower second reference value comprises a voltage between a first voltage associated with a first logic state and a second voltage associated with a second logic state; and the higher second reference value comprises a voltage between the second voltage associated with the second logic state and a third voltage associated with a third logic state.

8. The method of claim 4, further comprising:
biasing, before selecting the second reference value, a reference line associated with the second sense component to an initial value that is equal to the higher second reference value or the lower second reference value, wherein selecting the second reference value sets the reference line to the second reference value for comparing the signal at the node with the second reference value.

9. The method of claim 4, further comprising:
biasing, before selecting the second reference value, a reference signal associated with the second sense component to an initial value that is between the higher second reference value and the lower second reference value, wherein selecting the second reference value sets the reference signal to the second reference value for comparing the signal at the node with the second reference value.

10. The method of claim 4, further comprising:
biasing, before selecting the second reference value, a reference signal associated with the second sense component to an initial value that is equal to the first reference value, wherein selecting the second reference value sets the reference signal to the second reference value for comparing the signal at the node with the second reference value.

11. The method of claim 1, further comprising:
determining that a duration has elapsed after comparing the signal at the node to the first reference value, wherein comparing the signal at the node to the second reference value is based at least in part on the determination that the duration has elapsed.

12. The method of claim 1, wherein transferring the charge is based at least in part on a first voltage on the digit line being less than a second voltage on a gate of the first transistor.

13. An apparatus, comprising:
a memory cell coupled with a digit line and configured to store one of three or more logic states;
a transistor coupled with the digit line and a node, the transistor configured to transfer a charge between the digit line and the node during a read operation of the memory cell;
a first sense component coupled with the node and configured to compare a signal at the node with a first reference value based at least in part on the charge transferred between the digit line and the node;
a reference selector component coupled with the first sense component and configured to select, based on the comparison of the signal at the node with the first reference value, a second reference value different than the first reference value; and
a second sense component coupled with the node and the reference selector component and configured to compare the signal at the node with the selected second reference value to determine a logic state stored on the memory cell.

14. The apparatus of claim 13, further comprising:
an isolation component coupled with the node and configured to isolate the second sense component from the first sense component and from the node during a portion of the read operation.

15. The apparatus of claim 13, wherein the reference selector component comprises:
a first voltage source configured to provide a higher second reference value that is greater than the first reference value, and
a second voltage source configured to provide a lower second reference value that is less than the first reference value, wherein the second reference value is selected from a group comprising the higher second reference value and the lower second reference value.

16. The apparatus of claim 15, wherein the reference selector component comprises:
a second transistor configured to selectively couple the first voltage source with the second sense component based at least in part on being activated by an output of the first sense component, wherein the output is based at least in part on the comparison of the signal with the first reference value; and
a third transistor configured to selectively couple the second voltage source with the second sense component based at least in part on being activated by a complement of the output.

17. The apparatus of claim 16, further comprising:
a fourth transistor configured to selectively couple the second transistor with the first voltage source based at least in part on a strobe signal; and
a fifth transistor configured to selectively couple the third transistor with the second voltage source based at least in part on the strobe signal.

18. The apparatus of claim 15, further comprising:
a third voltage source coupled with a reference line of the second sense component, the third voltage source configured to bias, before the second reference value is selected, the reference line to an initial value equal to the higher second reference value or to the lower second reference value, wherein the second sense component is configured to compare the signal at the node with the second reference value by comparing the signal at the node with a signal at the reference line.

19. The apparatus of claim 15, further comprising:
a third voltage source coupled with a reference line of the second sense component, the third voltage source configured to bias, before the second reference value is selected, the reference line to an initial value between the higher second reference value and the lower second reference value, wherein the second sense component is configured to compare the signal at the node with the second reference value by comparing the signal at the node with a signal at the reference line.

20. The apparatus of claim 15, wherein the transistor is configured to transfer the charge between the digit line and the node based at least in part on a voltage of the digit line being less than a voltage on a gate of the transistor during the read operation.

21. A memory device, comprising:
a memory cell coupled with a digit line and configured to store one of three or more logic states;
a first sense component coupled with a node;
a second sense component coupled with the node;
a reference selector component coupled with the first sense component and the second sense component;
a transistor coupled with the node; and
a controller coupled with the memory cell, the controller operable to cause the memory device to:
transfer, with the transistor, a charge between the digit line and the node during a read operation of the memory cell;

compare, with the first sense component, a signal at the node to a first reference value;

select, with the reference selector component, a second reference value based at least in part on the comparison of the signal at the node to the first reference value, wherein the reference selector component is configured to select the second reference value from a group comprising a higher second reference value greater than the first reference value and a lower second reference value less than the first reference value;

compare, with the second sense component, the signal at the node to the selected second reference value; and determine, with the second sense component, at least a first bit associated with a logic state stored on the memory cell based at least in part on the comparison of the signal at the node to the selected second reference value.

22. The memory device of claim 21, wherein the controller is further operable to cause the memory device to:

determine, with the first sense component and based at least in part on the comparison of the signal at the node to the first reference value, whether the signal at the node is greater than the first reference value; and select, with the reference selector component, the second reference value based at least on the determination.

23. The memory device of claim 22, wherein the reference selector component is configured to:

select, based at least on a determination that the signal at the node is greater than the first reference value, the higher second reference value, and select, based at least on a determination that the signal at the node is less than the first reference value, the lower second reference value.

24. The memory device of claim 21, wherein the controller is further operable to cause the memory device to:

isolate, with an isolation component coupled with the first sense component and the second sense component, the first sense component from the second sense component during a portion of the read operation.

25. The memory device of claim 21, wherein the controller is further operable to cause the memory device to:

determine, with the first sense component, at least a second bit associated with the logic state based at least in part on the comparison of the signal at the node to the first reference value.

* * * * *